United States Patent
Iwane et al.

(10) Patent No.: US 11,163,010 B2
(45) Date of Patent: Nov. 2, 2021

(54) SECONDARY BATTERY DETERIORATION ESTIMATION DEVICE AND SECONDARY BATTERY DETERIORATION ESTIMATION METHOD

(71) Applicants: FURUKAWA ELECTRIC CO., LTD., Tokyo (JP); FURUKAWA AUTOMOTIVE SYSTEMS INC., Shiga (JP)

(72) Inventors: Noriyasu Iwane, Tokyo (JP); Taiji Mitsuyama, Tokyo (JP)

(73) Assignees: FURUKAWA ELECTRIC CO., LTD., Tokyo (JP); FURUKAWA AUTOMOTIVE SYSTEMS INC., Shiga (JP)

(*) Notice: Subject to any disclaimer, the term of this patent is extended or adjusted under 35 U.S.C. 154(b) by 288 days.

(21) Appl. No.: 16/144,985

(22) Filed: Sep. 27, 2018

(65) Prior Publication Data

US 2019/0033391 A1    Jan. 31, 2019

Related U.S. Application Data

(63) Continuation of application No. PCT/JP2017/012775, filed on Mar. 28, 2017.

(30) Foreign Application Priority Data

Mar. 29, 2016   (JP) .............................. JP2016-066620

(51) Int. Cl.
*G01R 31/392* (2019.01)
*H01M 10/48* (2006.01)
(Continued)

(52) U.S. Cl.
CPC ........... *G01R 31/392* (2019.01); *G01R 31/36* (2013.01); *G01R 31/367* (2019.01);
(Continued)

(58) Field of Classification Search
CPC ..... G01N 35/00871; G01N 2035/0091; G01N 2035/00881; H01M 10/42; H01M 10/48;
(Continued)

(56) References Cited

U.S. PATENT DOCUMENTS 8,719,195 B2    5/2014   Frisch et al.
9,312,722 B2    4/2016   Lee
(Continued)

FOREIGN PATENT DOCUMENTS

CN    101512365 A    8/2009
CN    101641606 A    2/2010
(Continued)

OTHER PUBLICATIONS

Office Action issued in the CN Patent Application No. 201780020780.8, dated Apr. 2, 2020, 19 pages (with translation).
(Continued)

*Primary Examiner* — Tarun Sinha
*Assistant Examiner* — Lal C Mang
(74) *Attorney, Agent, or Firm* — Amin, Turocy & Watson, LLP

(57) ABSTRACT

A secondary battery deterioration estimation device includes a memory; and a processor which executes the following processes based on executable programs stored in the memory, generating history information showing history of a use state of the secondary battery with reference to a signal output from a current sensor detecting a current flowing through the secondary battery; calculating values of elements forming an equivalent circuit of the secondary battery; calculating a state of health (SOH) of the secondary battery based on the values of the elements forming the equivalent circuit; correcting the values of the elements before the SOH is calculated or the value of the SOH obtained by the calculation based on the history information;
(Continued)

and outputting data representing the SOH of the secondary battery.

20 Claims, 11 Drawing Sheets

(51) Int. Cl.
*G01R 31/36* (2020.01)
*H02J 7/00* (2006.01)
*H01M 10/42* (2006.01)
*G01R 31/389* (2019.01)
*G01R 31/396* (2019.01)
*G01R 31/367* (2019.01)
*G01R 31/374* (2019.01)
*G01R 31/371* (2019.01)

(52) U.S. Cl.
CPC ......... *G01R 31/371* (2019.01); *G01R 31/374* (2019.01); *G01R 31/389* (2019.01); *G01R 31/396* (2019.01); *H01M 10/42* (2013.01); *H01M 10/48* (2013.01); *H02J 7/00* (2013.01)

(58) Field of Classification Search
CPC . H02J 7/00; Y02E 60/10; Y02T 10/70; G06Q 50/26; G01R 31/396; G01R 31/392; G01R 31/389; G01R 31/367; G01R 31/371; G01R 31/374; G01R 31/36; G01R 31/3842; G01R 31/3648
See application file for complete search history.

(56) References Cited

U.S. PATENT DOCUMENTS

| | | | |
|---|---|---|---|
| 9,678,164 | B2 | 6/2017 | Mitsuyama et al. |
| 2008/0054848 | A1 | 3/2008 | Yun et al. |
| 2009/0276172 | A1 | 11/2009 | Nishi |
| 2010/0153038 | A1 | 6/2010 | Tomura et al. |
| 2011/0084702 | A1 | 4/2011 | Mori |
| 2011/0161025 | A1 | 6/2011 | Tomura et al. |
| 2012/0007556 | A1 | 1/2012 | Matsui et al. |
| 2013/0027047 | A1 | 1/2013 | Yoshioka et al. |
| 2013/0030736 | A1 | 1/2013 | Tanaka |
| 2013/0091083 | A1 | 4/2013 | Frisch et al. |
| 2013/0110429 | A1* | 5/2013 | Mitsuyama ........... G01R 31/367 702/63 |
| 2013/0320989 | A1* | 12/2013 | Inoue ................ G01R 31/3606 324/427 |
| 2014/0333265 | A1* | 11/2014 | Kinjo ................ G01R 31/3679 702/63 |
| 2015/0127281 | A1 | 5/2015 | Kusano et al. |
| 2015/0326038 | A1 | 11/2015 | Lee |
| 2015/0377978 | A1 | 12/2015 | Mitsuyama et al. |
| 2016/0052419 | A1 | 2/2016 | Takahashi et al. |

FOREIGN PATENT DOCUMENTS

| | | |
|---|---|---|
| CN | 102043132 A | 5/2011 |
| CN | 102144169 A | 8/2011 |
| CN | 102183730 A | 9/2011 |
| CN | 102901928 A | 1/2013 |
| CN | 102918411 A | 2/2013 |
| CN | 103035961 A | 4/2013 |
| CN | 105026944 A | 11/2015 |
| CN | 105098869 A | 11/2015 |
| CN | 105190985 A | 12/2015 |
| JP | 2005221487 A | 8/2005 |
| JP | 2007187534 A | 7/2007 |
| JP | 2008058278 A | 3/2008 |
| JP | 2009-145065 A | 7/2009 |
| JP | 2011-106952 A | 6/2011 |
| JP | 2011214843 A | 10/2011 |
| JP | 2013-057537 A | 3/2013 |
| JP | 2014105995 A | 6/2014 |
| JP | 2015-090342 A | 5/2015 |
| JP | 2015141117 A | 8/2015 |
| JP | 5862836 B2 | 2/2016 |
| WO | 2011/118080 A1 | 9/2011 |
| WO | 2014080764 A1 | 5/2014 |

OTHER PUBLICATIONS

Extended European Search Report issued in the EP Patent Application No. EP17775158.3, dated Apr. 1, 2019.
International Search Report for PCT Application No. PCT/JP2017/012775, dated Jun. 20, 2017, 5 pages.
Final Office Action issued in U.S. Appl. No. 16/145,007 dated Feb. 17, 2021, 60 pages.
Office Action issued in CN Patent Application No. 201780020722.5, dated Jan. 14, 2021, 23 pages (with translation).
Non-Final Office Action received for U.S. Appl. No. 16/144,985 dated Nov. 2, 2020, 51 pages.
International Search Report for PCT Application No. PCT/JP2017/012776, dated Jul. 4, 2017, 5 pages.
Extended European Search Report issued in the EP Patent Application No. EP17775159.1, dated Apr. 11, 2019.
Office Action issued in the CN Patent Application No. 201780020722.5, dated Apr. 26, 2020, 23 pages (with translation).
Notice of Reasons for Refusal received for Japanese Patent Application Serial No. 2016-066620 dated Aug. 8, 2019, 9 pages.

* cited by examiner

SECONDARY BATTERY DETERIORATION ESTIMATION DEVICE AND SECONDARY BATTERY DETERIORATION ESTIMATION METHOD

CROSS-REFERENCE TO RELATED APPLICATIONS

This application is a continuation of, and claims priority to each of, international Patent Cooperation Treaty (PCT) Application No. PCT/JP2017/012775, filed Mar. 28, 2017, and entitled "SECONDARY BATTERY DETERIORATION ESTIMATION DEVICE AND SECONDARY BATTERY DETERIORATION ESTIMATION METHOD," which claims priority to Japanese Patent Application No. 2016-066620, filed on Mar. 29, 2016, the entireties of each of which applications are hereby incorporated by reference herein in their entireties.

TECHNICAL FIELD

The present invention relates to a secondary battery deterioration estimation device and a secondary battery deterioration estimation method.

BACKGROUND ART

Conventionally, there have been proposed arts to estimate a deterioration state of a secondary battery. For example, in the art disclosed in Patent Document 1, the deterioration state is estimated based on a use history of the secondary battery.

In the arts disclosed in Patent Documents 2, 3, an internal resistance or an equivalent circuit of the secondary battery is used, and a change from an initial value of each of the above is detected to estimate the deterioration of the secondary battery.

RELATED ART DOCUMENT

Patent Document

Patent Document 1: Japanese Patent Application Laid-open No. 2015-141117
Patent Document 2: Japanese Patent Application Laid-open No. 2005-221487
Patent Document 3: Japanese Patent Application Laid-open No. 2007-187534

SUMMARY OF INVENTION

In the art disclosed in Patent Document 1, when a kind of the secondary battery to be a target of the deterioration estimation is fixed without being changed, the deterioration state can be estimated with relatively high accuracy. However, for example, when the secondary battery which is mounted on an automobile or the like is the estimation target, there is a case when the secondary battery which is different from an initial kind may be mounted. In such a case, there is a problem that the estimation accuracy decreases.

Meanwhile, since the change from the initial value is detected in the arts disclosed in Patent Documents 2, 3, the deterioration state can be estimated with high accuracy even when the kind of the secondary battery to be the estimation target changes. However, according to the arts disclosed in Patent Documents 2, 3, when the secondary battery is formed by serially arranging a plurality of unit electrochemical cells, variation in a degree of deterioration occurs among respective unit electrochemical cells. In such a case, though the deterioration state is controlled by the unit cell which is the most deteriorated, only the internal resistance and the equivalent circuit components of a whole of the plurality of cells can be measured as the internal resistance and the equivalent circuit components of the secondary battery. Accordingly, there is a problem that the deterioration state cannot be accurately estimated when there is a variation in deterioration.

The present invention is made in consideration of the aforementioned circumstances, and an object of the present invention is to provide a secondary battery deterioration estimation device and a secondary battery deterioration estimation method capable of accurately estimating deterioration of various kinds of secondary batteries, and accurately estimating deterioration of the secondary battery even when there is a variation among cells.

To solve the aforementioned problems, the present invention is characterized in that a secondary battery deterioration estimation device estimating deterioration of the secondary battery, includes: a memory; and a processor which executes the following processes based on executable programs stored in the memory, generating history information showing history of a use state of the secondary battery with reference to a signal output from a current sensor detecting a current flowing through the secondary battery; calculating values of elements forming an equivalent circuit of the secondary battery; calculating a state of health (SOH) of the secondary battery based on the values of the elements forming the equivalent circuit; correcting the values of the elements before the SOH is calculated or the value of the SOH obtained by the calculation based on the history information; and outputting data representing the SOH of the secondary battery.

Such a configuration makes it possible to accurately estimate the deterioration of various kinds of secondary batteries, and to accurately estimate the deterioration of the secondary battery even when there is a variation among cells.

The present invention is characterized in that the processor calculates information regarding a variation of deterioration of cells forming the secondary battery from the history information, and corrects the values of the elements before the SOH is calculated or the value of the SOH obtained by the calculation based on the obtained information.

Such a configuration makes it possible to estimate the deterioration close to a real value based on the variation of the secondary battery.

The present invention is characterized in that the processor calculates a correction value where a value comes close to 1 when the variation is small compared to a case when the variation is large as the information regarding the variation of deterioration of the cells forming the secondary battery, and makes the correction by multiplying the SOH by the correction value.

Such a configuration makes it possible to the SOH can be corrected by a simple calculation.

The present invention is characterized in that the processor generates the history information based on at least one of a quantity of charged and discharged electricity for the secondary battery, a time or the number of times to be a predetermined state of charge or less, a time or the number of times to be the predetermined state of charge or more, and an elapsed time from a use start of the secondary battery.

Such a configuration makes it possible to accurately estimate the deterioration of the secondary battery based on parameters which can be easily measured.

The present invention is characterized in that the history information generated by the processor is stratified based on at least one of a state of charge, a voltage, a current, and a temperature of the secondary battery.

Such a configuration makes it possible to accurately estimate the deterioration of the secondary battery based on the amount of charge and discharge or the like of a predetermined layer obtained by the stratification.

The present invention is characterized in that the equivalent circuit of the secondary battery calculated by the processor includes at least one of a resistance component corresponding to a conductor element and an electrolytic solution resistance in the secondary battery, a resistance component corresponding to a reaction resistance of an active material reaction of an electrode, and a capacitive component corresponding to an electric double layer of an interface between the electrode and the electrolytic solution.

Such a configuration makes it possible to accurately estimate the deterioration regardless of the kind of the secondary battery by using at least one of these components of the equivalent circuit.

The present invention is characterized in that the processor estimates the deterioration state of the secondary battery after the components forming the equivalent circuit are corrected to values at a temperature and a state of charge under a reference state.

Such a configuration makes it possible to accurately estimate the deterioration of the secondary battery regardless of the temperature or the state of charge at the estimation time.

The present invention is characterized in that an output circuit which outputs warning when the value of the SOH obtained by the correction by the processor is smaller than a predetermined threshold value.

Such a configuration makes it possible to notify a user of the deterioration state of the secondary battery.

The present invention is characterized in that a secondary battery deterioration estimation device estimating deterioration of a secondary battery includes: a unit which generates history information showing history of charge and discharge of the secondary battery with reference to a signal output from a current sensor detecting a current flowing through the secondary battery; a unit which calculates values of elements forming an equivalent circuit of the secondary battery; a unit which calculates a state of health (SOH) of the secondary battery based on the values of the elements forming the equivalent circuit; and a unit which corrects the values of the elements before the SOH is calculated or the value of the SOH obtained by the calculation based on the history information.

Such a configuration makes it possible to accurately estimate the deterioration of various kinds of secondary batteries, and to accurately estimate the deterioration of the secondary battery even when there is a variation among cells.

The present invention is characterized in that a secondary battery deterioration estimation method estimating deterioration of the secondary battery, to be performed by a programmable processor connected to a current sensor detecting a current flowing through the secondary battery, the method includes: generating history information showing history of a use state of the secondary battery with reference to a signal output from the current sensor; calculating values of elements forming an equivalent circuit of the secondary battery; calculating a state of health (SOH) of the secondary battery based on the values of the elements forming the equivalent circuit; correcting the values of the elements before the SOH is calculated or the value of the SOH obtained by the calculation based on the history information; and outputting data representing the SOH of the secondary battery.

Such a method makes it possible to accurately estimate the deterioration of various kinds of secondary batteries, and to accurately estimate the deterioration of the secondary battery even when there is a variation among cells.

According to the present invention, it is possible to provide a secondary battery deterioration estimation device and a secondary battery deterioration estimation method capable of accurately estimating deterioration of various kinds of secondary batteries, and accurately estimating deterioration of the secondary battery even when there is a variation among cells.

It is to be understood that both the foregoing general description and the following detailed description are exemplary and explanatory, and are intended to provide further explanation of the invention as claimed.

DESCRIPTION OF EMBODIMENTS

Next, an embodiment of the present invention will be described.

(A) Explanation of Configuration of Embodiment of Present Invention

Figure 1:
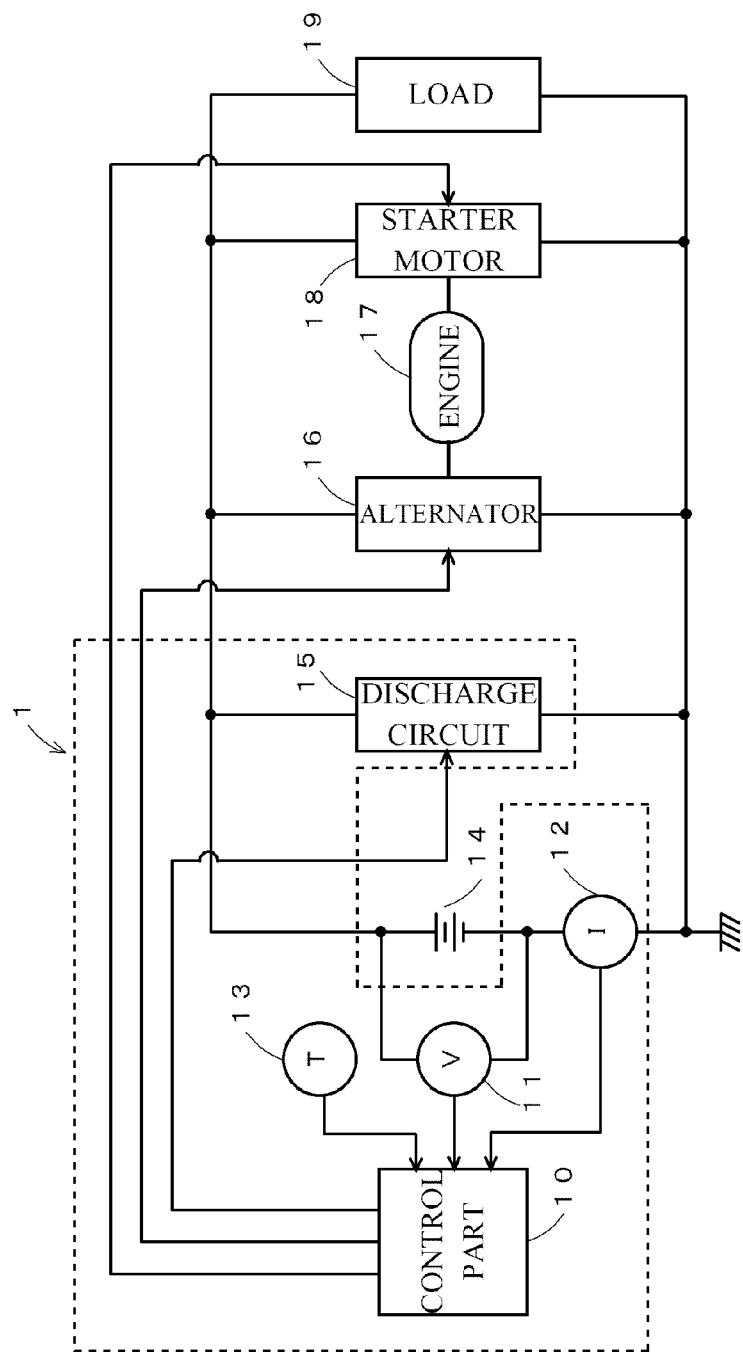
FIG. 1 is a diagram illustrating a configuration example of a secondary battery deterioration estimation device according to an embodiment of the present invention.

FIG. 1 is a diagram illustrating a power supply system of a vehicle having a secondary battery deterioration estimation device according to the embodiment of the present invention. In this drawing, a secondary battery deterioration estimation device 1 includes a control part 10, a voltage sensor 11, a current sensor 12, a temperature sensor 13, and a discharge circuit 15 as main constituent elements, and controls a charging state of a secondary battery 14. Here, the control part 10 controls the charging state of the secondary battery 14 by referring to outputs from the voltage sensor 11, the current sensor 12, and the temperature sensor 13 to detect the state of the secondary battery 14 and controlling a power generation voltage of an alternator 16. The voltage sensor 11 detects a terminal voltage of the secondary battery 14, and notifies the control part 10. The current sensor 12 detects a current flowing through the secondary battery 14, and notifies the control part 10. The temperature sensor 13 detects an environmental temperature of the secondary battery 14 in itself or a periphery thereof, and notifies the control part 10. The discharge circuit 15 is formed by, for example, a semiconductor switch, a resistance element, and so on which are seriously connected, and intermittently discharges the secondary battery 14 by the semiconductor switch which is on/off controlled by the control part 10.

The secondary battery 14 is formed by, for example, a lead-acid battery, a nickel-cadmium battery, a nickel hydride battery, a lithium ion battery, or the like, charged by the alternator 16, starts an engine by driving a starter motor 18, and supplies electric power to a load 19. The alternator 16 is driven by an engine 17, generates alternating-current power, and converts it into direct-current power by a rectifying circuit to charge the secondary battery 14. The alternator 16 is controlled by the control part 10, and is able to adjust the power generation voltage.

The engine 17 is formed by, for example, a reciprocal engine such as a gasoline engine and a diesel engine, or a rotary engine and the like, started by the starter motor 18, drives driving wheels through a transmission to supply propulsive force to a vehicle, and generates electric power by driving the alternator 16. The starter motor 18 is formed by, for example, a direct-current motor, generates rotational force by the electric power supplied from the secondary battery 14, and starts the engine 17. The load 19 is formed by, for example, an electric steering motor, a defogger, a sheet heater, an ignition coil, a car audio, a car navigation, and the like, and operated by the electric power from the secondary battery 14.

Figure 2:
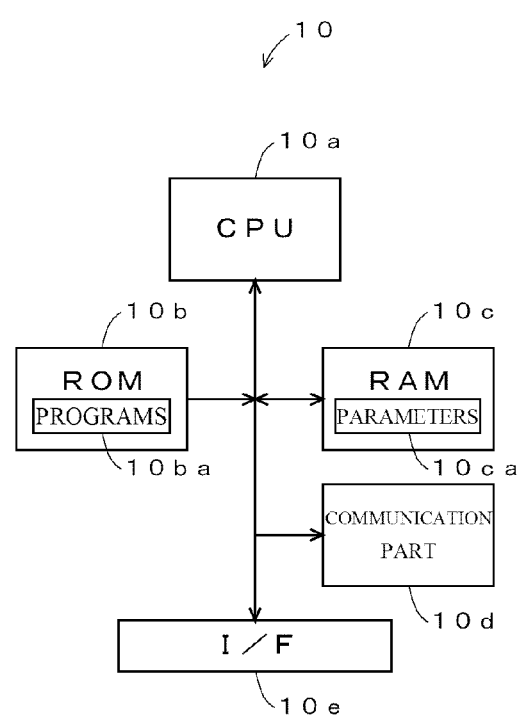
FIG. 2 is a block diagram illustrating a detailed configuration example of a control part in FIG. 1.

FIG. 2 is a diagram illustrating a detailed configuration example of the control part 10 illustrated in FIG. 1. As illustrated in this drawing, the control part 10 includes a CPU (central processing unit) 10a, a ROM (read-only memory) 10b, a RAM (random access memory) 10c, a communication part 10d, and an I/F (interface) 10e. Here, the CPU 10a controls each part based on programs 10ba stored in the ROM 10b. The ROM 10b is formed by a semiconductor memory or the like, and stores the programs 10ba and so on. The RAM 10c is formed by a semiconductor memory or the like, and stores data generated when the programs 10ba are executed and parameters 10ca such as later-described numerical expressions or tables. The communication part 10d performs communication with an ECU (electronic control unit) or the like being a higher device, and notifies the higher device of detected information or control information. The I/F 10e converts signals supplied from the voltage sensor 11, the current sensor 12, and the temperature sensor 13 into digital signals to take in, supplies a drive current to the discharge circuit 15, the alternator 16, the starter motor 18, and the like to control them.

In the example in FIG. 2, one CPU 10a is included, but distributed processing may be executed by using a plurality of CPUs. The control part 10 may be formed by a DSP (digital signal processor), an FPGA (field programmable gate array), an ASIC (application specific integrated circuit), and the like instead of the CPU. Processing may be performed by a general-purpose processor executing functions by reading software programs or a computer on a server through a cloud computing. In FIG. 2, the ROM 10b and the RAM 10c are included, but for example, a storage device other than the above (for example, an HDD (hard disk drive) being a magnetic storage device) may be used.

(B) Explanation of Operations of Embodiment of Present Invention

Next, operations of the embodiment of the present invention will be described. In the following, a principle of operation of the embodiment of the present invention is explained, and then detailed operations are explained.

Figure 3:
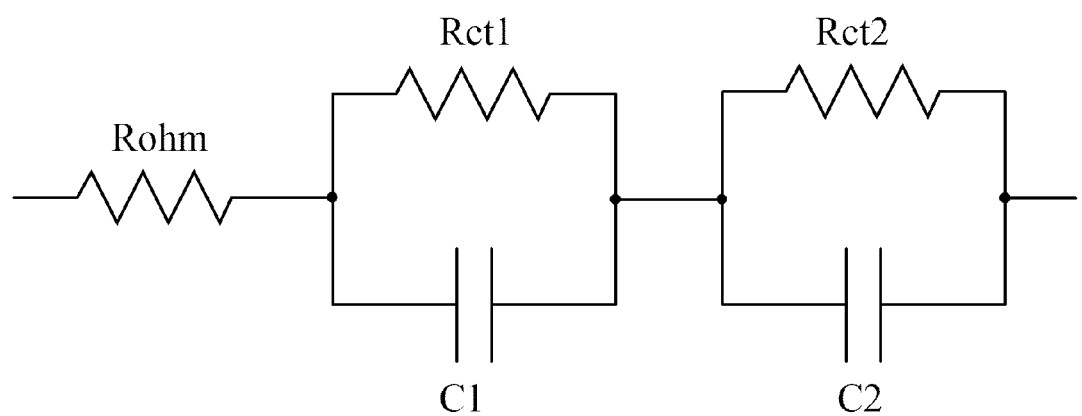
FIG. 3 is a diagram illustrating an example of an equivalent circuit of the secondary battery illustrated in FIG. 1.

First, the principle of operation of this embodiment is explained. In this embodiment, an equivalent circuit of the secondary battery 14 illustrated in FIG. 3 is found by learning processing or fitting processing, to calculate components of the equivalent circuit. In the example in FIG. 3, the equivalent circuit includes Rohm being a resistance component corresponding to a conductor element and an electrolytic solution resistance in the secondary battery 14, Rct1, Rct2 each being a resistance component corresponding to a reaction resistance of an active material reaction of an electrode, and C1, C2 each being a capacitive component corresponding to an electric double layer at an interface between the electrode and the electrolytic solution. Values of the resistance components increase and values of the capacitive components decrease in accordance with deterioration of the secondary battery 14. Accordingly, a SOH (state of health) of the secondary battery 14 is calculated by substituting equivalent circuit components found as stated above into an expression (1) shown below to estimate a deterioration state.

$$SOH = f(Rohm, Rct1, Rct2, C1, C2) \qquad (1)$$

An estimation method using the components forming the equivalent circuit as above has a characteristic capable of accurately estimating deterioration regardless of a kind of the secondary battery.

On the other hand, the deterioration estimation through the above method cannot perform the accurate estimation when there is a variation in deterioration of cells forming the secondary battery 14.

Figure 4A:
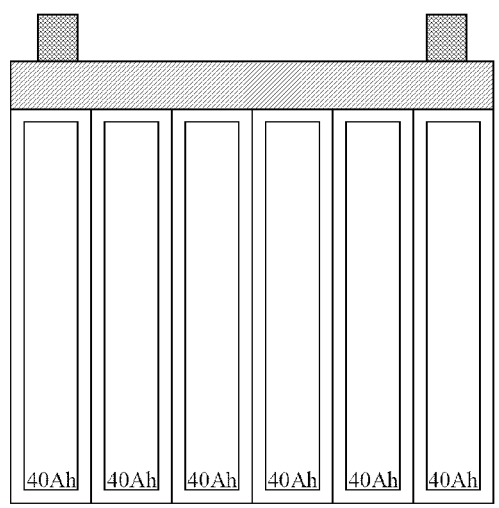
FIG. 4A is a diagram illustrating a state before deterioration of the cells of the secondary battery progresses.
Figure 4B:
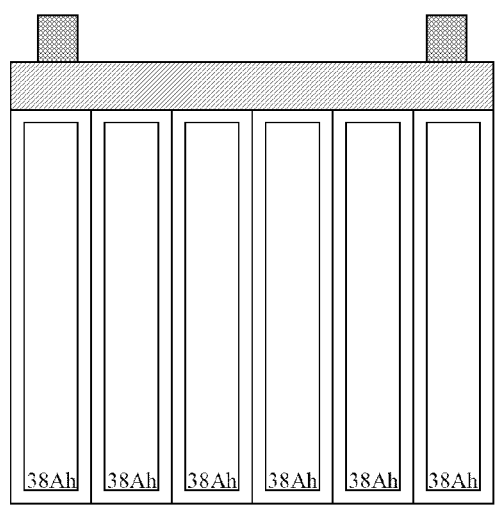
FIG. 4B is a diagram illustrating a state in which degradation of the cells of the secondary battery progresses uniformly.

As illustrated in FIG. 4A, for example, when the secondary battery 14 where capacitances of all cells are each 40 Ah in a new article is an estimation target, and the capacitance of all cells are deteriorated to 38 Ah as illustrated in FIG. 4B, for example, due to use thereof. In such a case, the deterioration of the secondary battery 14 can be accurately estimated through the expression (1) because all cells are equally deteriorated.

Figure 4C:
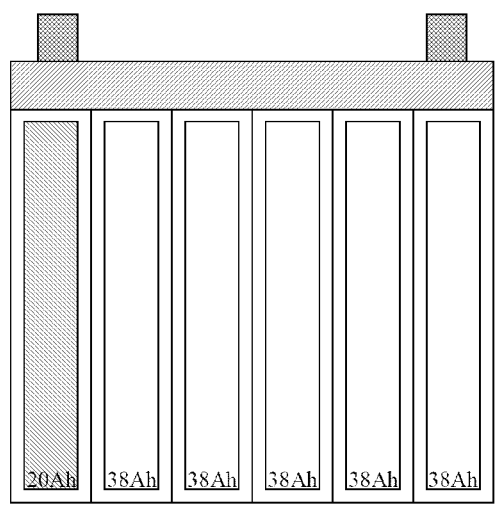
FIG. 4C is a diagram illustrating a state in which degradation of the cells of the secondary battery progresses disproportionately.

However, as illustrated in FIG. 4C, when only a cell at a left end deteriorates to 20 Ah and other cells deteriorate to 38 Ah, the SOH is controlled by an effect of the left end cell which deteriorates the most. Since the equivalent circuit illustrated in FIG. 3 is an equivalent circuit whose target is all cells of the secondary battery 14, the effect of the most deteriorated cell at the left end is averaged even under the deterioration state as illustrated in FIG. 4C. Accordingly, when there is a variation in deterioration as illustrated in FIG. 4C, the SOH calculated by using the expression (1) is not accurate because the state of the most deteriorated cell at the left end is not sufficiently reflected.

More concretely, when the deterioration is estimated by using the equivalent circuit, since the estimated deterioration corresponds to an average capacitance of all cells when a function to find an average value of six cells is expressed as, for example, ave( ), a value close to ave(20 Ah, 38 A, 38 Ah, 38 Ah, 38 Ah, 38 Ah)=35 Ah is estimated from the expression (1) in the case of FIG. 4C. Meanwhile, since an actual SOH depends on the most deteriorated cell, when a function to find a minimum value of six cells is expressed as min( ), a value of min(20 Ah, 38 A, 38 Ah, 38 Ah, 38 Ah, 38 Ah)=20 Ah becomes a value close to a real value in the case of FIG. 4C. In the case of FIG. 4B, the SOH found by the expression (1) becomes a value close to the real value because ave(38 Ah, 38 A, 38 Ah, 38 Ah, 38 Ah, 38 Ah)=38 Ah and min(38 Ah, 38 A, 38 Ah, 38 Ah, 38 Ah, 38 Ah)=38 Ah.

When the secondary battery 14 where there was a variation in deterioration among cells was examined, it turned out that a specific trend exists in a use method. That is, it became clear that there is the trend of occurrence of the variation in deterioration among cells when overcharge or over-discharge occurs, or charge and discharge are repeated in a short period as examples.

In this embodiment, it is possible to find the SOH closer to a real value by executing the learning processing or the fitting processing to find the components forming the equivalent circuit illustrated in FIG. 3, storing history (history information) of a use state of the secondary battery 14, and correcting the expression (1) by using a predetermined function when there is the use history which causes the variation in deterioration among cells of the secondary battery 14. For example, the following expression (2) can be used as the correction method. Where g( ) is a function having a value of 1 or less, and the value comes close to 1 when the variation in deterioration among cells is small, and the value becomes smaller as the variation in deterioration among cells becomes larger. That is, when the secondary battery 14 is brand-new as illustrated in FIG. 4A, g( )=1, and when there is not the variation of the secondary battery 14 as illustrated in FIG. 4B even when the deterioration progresses, g( )=1. Meanwhile, when there is the variation in deterioration of the secondary battery 14 as illustrated in FIG. 4C, g( ) becomes a value having a value close to min( )/ave( ), for example.

$$SOH = f(Rohm, Rct1, Rct2, C1, C2) \times g(1 \text{ or a plurality of variables in accordance with the use history}) \quad (2)$$

As it is described later, at least one of a charge amount, a discharge amount, a charge time, or a discharge time in a predetermined SOC can be set as the value of 1 or the plurality of variables in accordance with the use history. At least one of a charge amount, a discharge amount, a charge time, or a discharge time at a predetermined temperature, voltage, current may be used. It goes without saying that other variables can be used.

Next, the more detailed operations of the embodiment of the present invention are explained with reference to FIG. 5 and FIG. 6.

In this embodiment, for example, at a timing when the discharge circuit 15 discharges the secondary battery 14 or at a timing when the engine 17 is started, the CPU 10a measures a voltage and a current of the secondary battery 14, and the components of the equivalent circuit illustrated in FIG. 3 are optimized through the learning processing based on measured results. As the optimization method, for example, an optimum state vector X is estimated through an extended Kalman filter arithmetic operation, and adjustment parameters (components) of the equivalent circuit are updated to optimum ones from the estimated state vector X as it is described in U.S. Pat. No. 4,532,416. Concretely, a voltage drop ΔV when the secondary battery 14 is discharged at a predetermined current pattern is calculated based on the equivalent circuit using the adjustment parameters obtained from the state vector X under a certain state, and the state vector X is updated such that the voltage drop ΔV comes close to an actual measurement value. Then, the optimum adjustment parameters are calculated from the state vector X which is optimized by the update.

It is also possible that a temporal change of the voltage value is obtained at a pulse discharge time of the secondary battery 14, and parameters of a predetermined function is calculated by performing fitting of the obtained change of the voltage value by using the predetermined function where time is set as a variable, and the components of the equivalent circuit of the secondary battery 14 are found based on the calculated parameters of the predetermined function, as it is described in WO2014/136593.

It goes without saying that the components of the equivalent circuit may be found through other methods.

The components of the equivalent circuit found as stated above are corrected to values under a reference state. For example, a state when the temperature is 25° C. and the SOC is 100% is set as the reference state. When the learning processing or the fitting processing is executed, the temperature and the SOC at that time are measured, and the components are corrected to values under the reference state. It is possible to find accurate values even when the learning or the fitting is executed in a different environment by performing the correction as stated above.

In this embodiment, for example, the CPU 10a obtains history of a use state from a time when use of the secondary battery 14 is started, and stores in the RAM 10c. Examples of the history of the use state include, for example, a quantity of electricity charged and discharged for the secondary battery 14, a frequency of reaching a predetermined state of charge or less, a frequency of reaching a predetermined state of charge or more, and an elapsed time from the time when the use of the secondary battery 14 is started, and so on. In more detail, a charging capacity, a discharging capacity, a charge time, and a discharge time are stratified depending on a value of the SOC can be used as an example. At this time, information regarding the use history for a relatively long period where the effect of the variation in deterioration among cells of the secondary battery 14 is exerted is preferably used as the history of the use state. For example, information regarding not only the latest one driving but also a plurality of times of drivings are preferably included, and information for a long period regarding the history of the use state from the time when the use of the secondary battery 14 is started is more preferable.

Figure 5A:
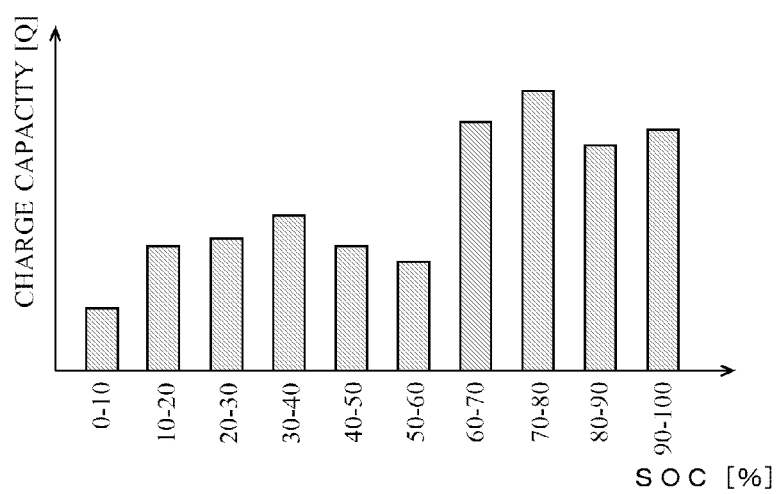
FIG. 5A is a chart illustrating an example of a use history regarding charging capacity.
Figure 5B:
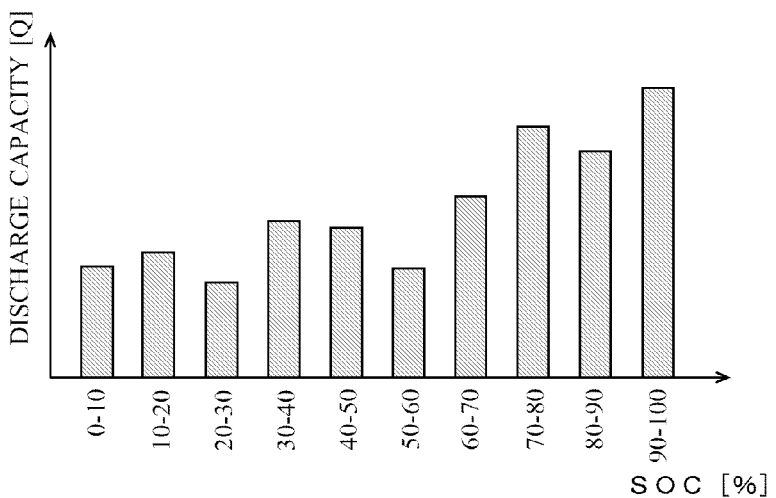
FIG. 5B is a chart illustrating an example of a use history regarding discharging capacity.

FIG. 5 are each a chart where the SOC is divided into 10 parts by every 10% from "0" (zero) to 100%, and a charge time and a discharge time are graphed in each divided range. In more detail, FIG. 5A illustrates an integrated value of the charging capacity in each range when the SOC is divided into 10 parts by every 10%. FIG. 5B illustrates an integrated value of the discharging capacity in each range when the SOC is divided into 10 parts by every 10%.

FIG. 6 are each a chart where the SOC is divided into 10 parts by every 10% from "0" (zero) to 100%, and a charge time and a discharge time are graphed in each divided range.

Figure 6A:
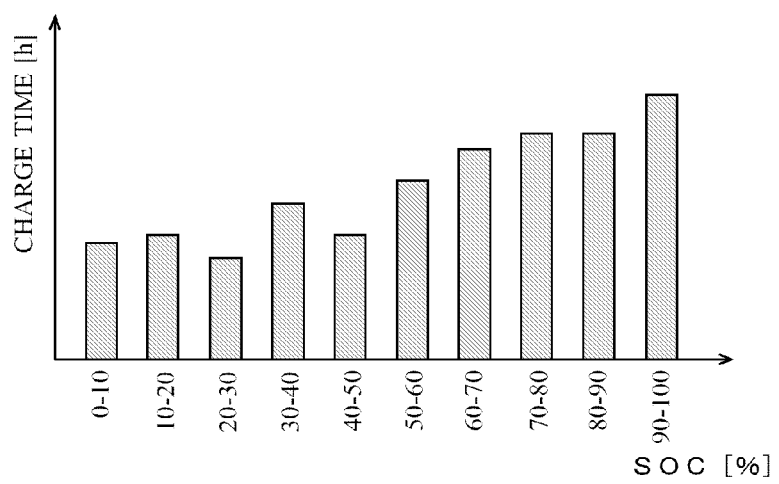
FIG. 6A is a chart illustrating an example of a use history regarding charging time.
Figure 6B:
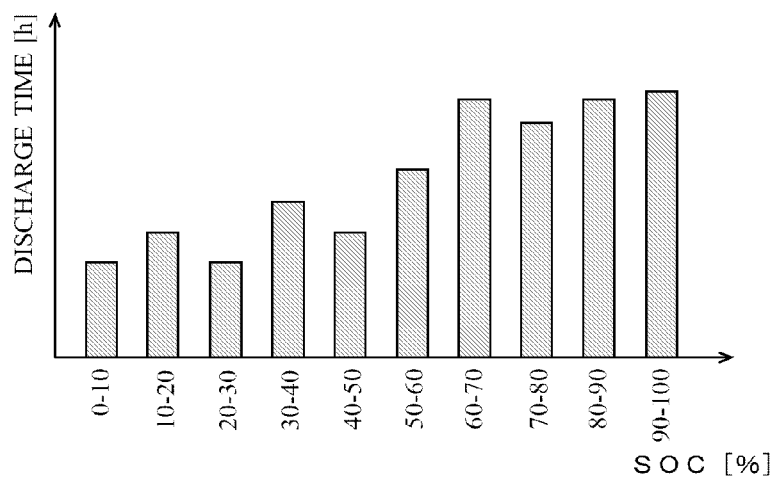
FIG. 6B is a chart illustrating an example of a use history regarding discharging time.

In more detail, FIG. 6A illustrates an integrated value of the charge time in each range when the SOC is divided into 10 parts by every 10%. FIG. 6B illustrates an integrated value of the discharge time in each range when the SOC is divided into 10 parts by every 10%.

The CPU 10a adjusts the parameters or the like of the function such that the value of g( ) of the expression (2) becomes small when the charge and discharge are performed for a predetermined time or more, or the charge or the discharge is performed for a predetermined capacity or more under, for example, a low SOC state (for example, a state when the SOC is less than 40%) because the charge and discharge are performed under the over-discharging state, and probability where the variation in deterioration occurs increases. The CPU 10a adjusts the parameters or the like of the function such that the value of g( ) of the expression (2) becomes small when the charge is performed for a predetermined time or more, or the charge is performed for a predetermined capacity or more under a high SOC state (for example, a state when the SOC is 90% or more) because the charge is performed under the overcharging state, and the probability where the variation in deterioration occurs similarly increases.

When the deterioration of the secondary battery 14 is estimated, the CPU 10a substitutes the components of the equivalent circuit obtained by the learning processing or the fitting processing into parentheses of f( ) of the expression (2), and substitutes the variables regarding the history of the use state into parentheses of g( ) of the expression (2), to find the SOH of the secondary battery 14.

As described hereinabove, since the deterioration state of the secondary battery 14 is estimated based on the equivalent circuit illustrated in FIG. 3, the deterioration can be accurately estimated regardless of the kinds of the secondary battery 14 according to the embodiment of the present invention.

In the embodiment of the present invention, since the equivalent circuit is used, and the estimation result is corrected based on the history of the use state, that is, the information regarding the variation progress of deterioration of the cells forming the secondary battery 14, the deterioration state can be accurately estimated even when, for example, there is a variation in deterioration among cells as illustrated in FIG. 4C.

Figure 7:
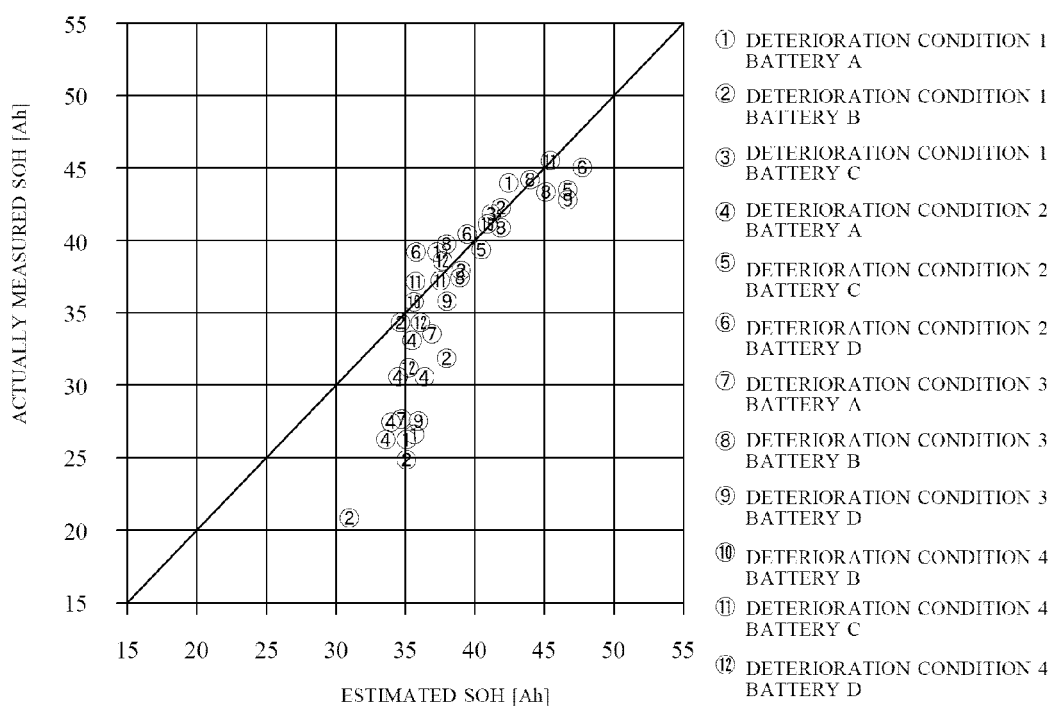
FIG. 7 is a chart illustrating a relation between an estimated SOH and an actually measured SOH when various secondary batteries are measured by using a conventional example.

FIG. 7 is a chart illustrating measured results when the correction is not made by using the history of the use state. A horizontal axis in FIG. 7 shows the SOH estimated from the equivalent circuit parameters without correcting by using the use history, and a vertical axis shows the actually measured SOH. Circled numerals represent estimation results of various secondary batteries under various deterioration conditions. In FIG. 7, it is shown that the estimation accuracy becomes higher as a value comes close to a line segment of y=x. As illustrated in FIG. 7, the value deviates from the line segment of y=x as the SOH decreases resulting in that the estimation accuracy decreases when the history of the use state is not considered.

Figure 8:
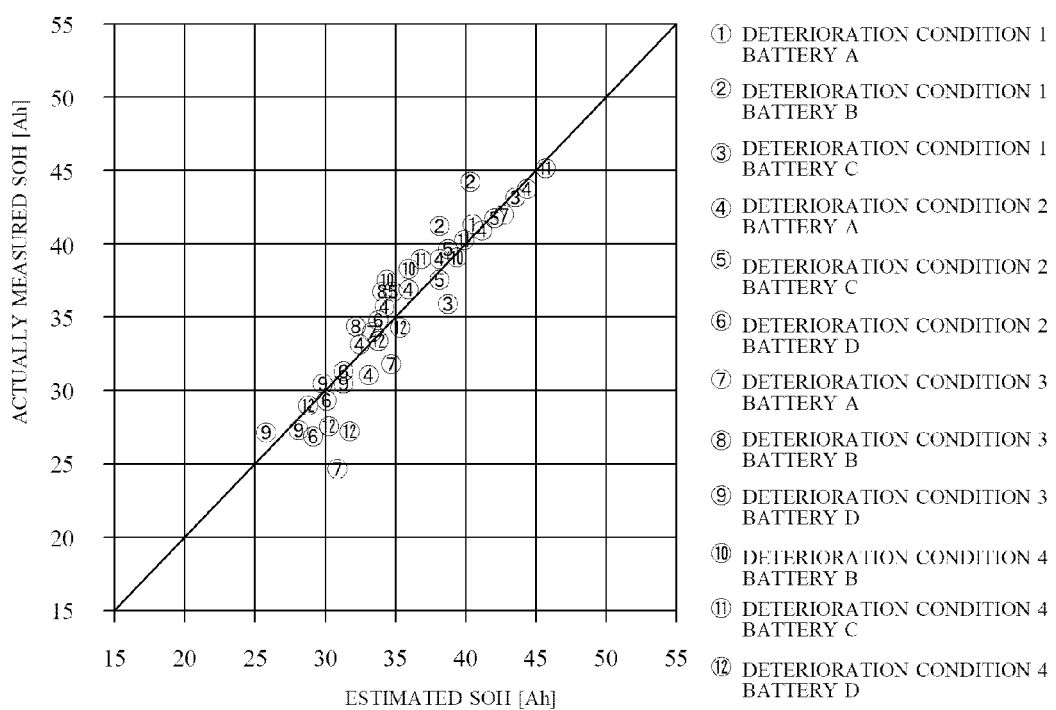
FIG. 8 is a chart illustrating a relation between an estimated SOH and an actually measured SOH when various secondary batteries are measured by using the present embodiment.

FIG. 8 is a chart illustrating measured results according to this embodiment (the correction is made by using the history of the use state). In FIG. 8, the estimation accuracy does not decrease even when the SOH decreases compared to FIG. 7. That is, in this embodiment, the SOH can be accurately found even when there is the variation in deterioration among cells by making the correction by using the history of the use state.

Next, an example of processes executed in the embodiment of the present invention is explained with reference to FIG. 9 to FIG. 11.

Figure 9:
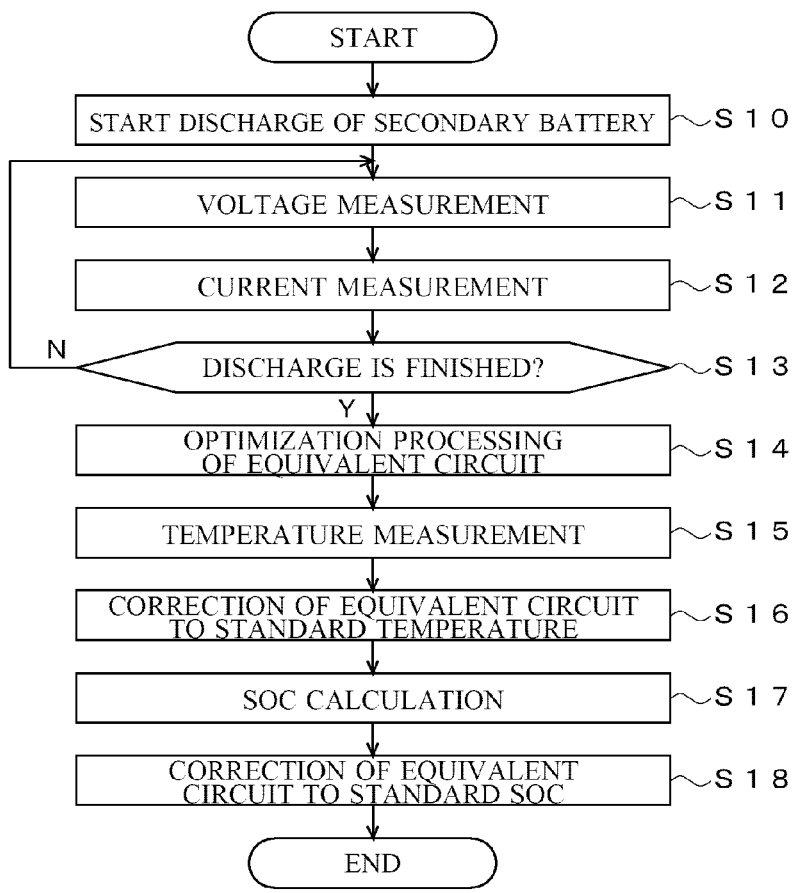
FIG. 9 is an example of a flowchart to explain a flow of processes executed in the embodiment illustrated in FIG. 1.

FIG. 9 is a flowchart executed when the equivalent circuit is learned or fitted. When the processing of the flowchart illustrated in FIG. 9 is started, the following steps are executed.

At Step S10, the CPU 10a starts the discharge of the secondary battery 10. For example, the CPU 10a discharges the secondary battery 14 by performing a switching control of the discharge circuit 15. Opportunities for discharging by means of the starter motor 18 or the load 19 may be used instead of the discharge circuit 15.

At Step S11, the CPU 10a measures the terminal voltage of the secondary battery 14 with reference to the output of the voltage sensor 11.

At Step S12, the CPU 10a measures the current flowing through the secondary battery 14 with reference to the output of the current sensor 12.

At Step S13, the CPU 10a determines whether the discharge is finished, and when it is determined to be finished (Step S13:Y), the process goes to Step S14, and in other cases (Step S13:N), the process returns to Step S11 to repeat the similar processes as stated above.

At Step S14, the CPU 10a executes optimization of each component of the equivalent circuit. As the optimization method, for example, the optimum state vector X is estimated through the extended Kalman filter arithmetic operation, and the adjustment parameters (components) of the equivalent circuit are updated to optimum ones from the estimated state vector X, as it is described in U.S. Pat. No. 4,532,416. Concretely, the voltage drop $\Delta V$ when the secondary battery is discharged in the predetermined current pattern is calculated based on the equivalent circuit using the adjustment parameters obtained from the state vector X under a certain state, and the state vector X is updated such that the voltage drop $\Delta V$ comes close to an actual measurement value. Then, the optimum adjustment parameters are calculated from the state vector X which is optimized by the update. It is also possible that a temporal change of the voltage value is obtained at a pulse discharge time of the secondary battery 14, and parameters of a predetermined function are calculated by making fitting of the obtained change of the voltage value by using the predetermined function where time is set as a variable, and the components of the equivalent circuit of the secondary battery 14 are found based on the calculated parameters of the predetermined function, as it is described in WO2014/136593. It goes without saying that other methods than the above can be used.

At Step S15, the CPU 10a measures the temperature. In more detail, the CPU 10a measures the temperature of the secondary battery 14 in itself or a periphery thereof with reference to the output of the temperature sensor 13.

At Step S16, the CPU 10a corrects each component of the equivalent circuit which is optimized at Step S14 to a value at a standard temperature. For example, when the standard temperature is 25° C., the component is corrected to the value at the standard temperature by multiplying a correction coefficient corresponding to a difference value between, for example, the current temperature measured at Step S15 and 25° C. It goes without saying that the standard temperature may be the temperature other than 25° C.

At Step S17, the CPU 10a calculates the SOC of the secondary battery 14. For example, the SOC is calculated based on an OCV (open circuit voltage) of the secondary battery 14.

At Step S18, the CPU 10a corrects each component of the equivalent circuit which is optimized at Step S14 to a value at a standard SOC. For example, when the standard SOC is 100%, the component is corrected to the value at the standard SOC by multiplying a correction coefficient corresponding to a difference value between, for example, the current SOC calculated at Step S17 and 100%. It goes without saying that the standard SOC may be the value other than 100%.

Next, processing storing the history of the use state is explained with reference to FIG. 10. When the processing in a flowchart in FIG. 10 is started, the following steps are executed.

At Step S30, the CPU 10a calculates the SOC of the secondary battery 14. For example, the SOC is calculated based on the OCV of the secondary battery 14.

At Step S31, the CPU 10a executes integrating processing of a charging current of the secondary battery 14. In more detail, the CPU 10a performs the integrating processing of the current flowing into the secondary battery 14 by each range of the SOC with reference to the output of the current sensor 12. As a result, the history information as illustrated in FIG. 5A is obtained.

At Step S32, the CPU 10a executes integrating processing of a discharging current of the secondary battery 14. In more detail, the CPU 10a performs the integrating processing of the current flowing out of the secondary battery 14 by each range of the SOC with reference to the output of the current sensor 12. As a result, the history information as illustrated in FIG. 5B is obtained.

At Step S33, the CPU 10a executes integrating processing of the charge time of the secondary battery 14. In more detail, the CPU 10a performs the integrating processing of the time in a charging state by each range of the SOC with reference to the output of the current sensor 12. As a result, the history information as illustrated in FIG. 6A is obtained.

At Step S34, the CPU 10a executes integrating processing of the discharge time of the secondary battery 14. In more detail, the CPU 10a performs the integrating processing of the time in a discharging state by each range of the SOC with reference to the output of the current sensor 12. As a result, the history information as illustrated in FIG. 6B is obtained.

At Step S35, the CPU 10a stores the values calculated at Step S31 to Step S34 in the RAM 10c as the history information.

At Step S36, the CPU 10a determines whether the processes are to be repeated, and when it is determined to repeat the process (Step S36: Y), the process returns to Step S30 to repeat the similar processes as the above-stated case, and in other cases (Step S36: N), the processes are finished.

Figure 10:
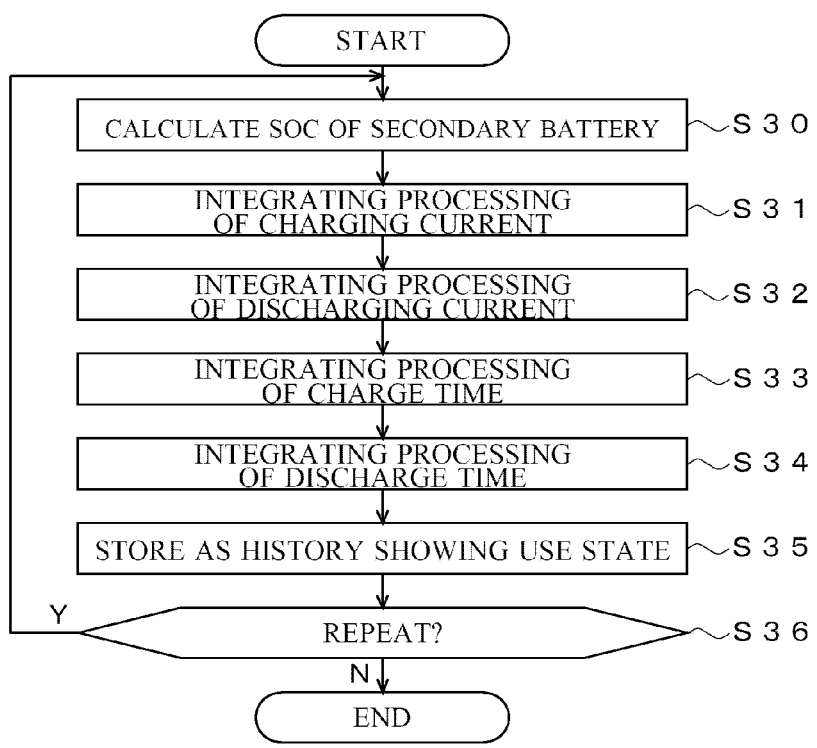
FIG. 10 is an example of a flowchart to explain a flow of processes executed in the embodiment illustrated in FIG. 1.
Figure 11:
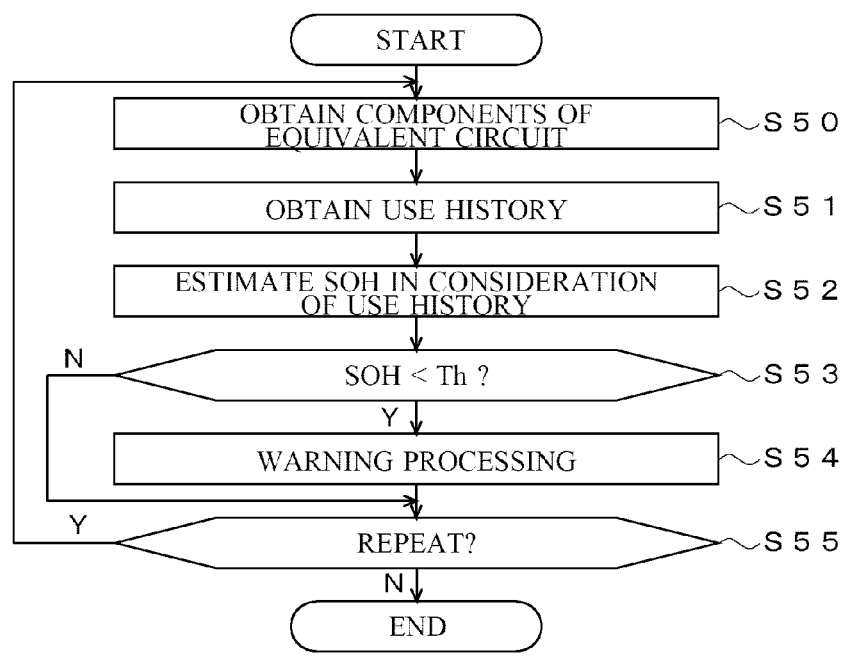
FIG. 11 is an example of a flowchart to explain a flow of processes executed in the embodiment illustrated in FIG. 1.

Next, there is described processing to estimate the deterioration state of the secondary battery 14 based on the components of the equivalent circuit obtained through the flowchart illustrated in FIG. 9 and the history information obtained through the flowchart illustrated in FIG. 10 with reference to FIG. 11. When a flowchart illustrated in FIG. 11 is started, the following steps are executed.

At Step S50, the CPU 10a obtains the components of the equivalent circuit. In more detail, the CPU 10a obtains the components (Rohm, Rct1, Rct2, C1, C2) of the equivalent circuit which are optimized by the process at Step S14 and standardized at Step S16 and Step S18 in FIG. 9 from the RAM 10c.

At Step S51, the CPU 10a obtains the use history. In more detail, the CPU 10a obtains the use history stored by the process at Step S35 in FIG. 10 from the RAM 10c.

At Step S52, the CPU 10a calculates the SOH while taking the use history into consideration. In more detail, the CPU 10a substitutes the values of the components of the equivalent circuit into a first term on a right side of the expression (2), and substitutes a variable regarding the use history into a second term on the right side, to find the SOH. In other words, the CPU 10a finds the SOH by substituting the components of the equivalent circuit into the first term on the right side of the expression (2), and corrects the SOH based on the use history by substituting the use history into the second term on the right side. The estimated SOH may be notified to a user.

At Step S53, the CPU 10a determines whether the SOH found at Step S52 is less than a predetermined threshold value Th, and when it is determined to be less than the threshold value Th (Step S53: Y), the process goes to Step S54, and in other cases (Step S53: N), the process goes to Step S55. For example, when the SOH is less than 50% of an initial value, it is determined to be Y, and the process goes to Step S54.

At Step S54, the CPU 10a executes warning processing. For example, the CPU 10a notifies a higher device that the SOH decreases through the communication part 10d. As a result, the higher device issues a warning to an operator. For example, an alarm issuing a warning sound can be used as an output circuit as a method issuing the warning. In addition, for example, a text data or an image data indicating that the secondary battery 14 deteriorates may be displayed on a display as an output circuit.

At Step S55, the CPU 10a determines whether the processes are to be repeated, and when it is determined to repeat the process (Step S55: Y), the process returns to Step S50 to repeat the similar processes as the above-stated case, and in other cases (Step S55: N), the processes are finished.

According to the above processes, the operations described with reference to FIG. 3 to FIG. 6 are enabled.

(C) Explanation of Modified Embodiment

The embodiment described hereinabove is an example, and it goes without saying that this invention is not limited to the above-stated cases. For example, in the above-stated embodiment, the equivalent circuit illustrated in FIG. 3 is used, but other equivalent circuits may be used. For example, in FIG. 3, parallel elements of Rct1 and C1, and parallel elements of Rct2 and C2 are included to correspond to a positive electrode and a negative electrode, but an equivalent circuit may include either one of the parallel elements. An equivalent circuit where three or more parallel elements are connected may be used. Further, an equivalent circuit formed of only the internal resistance R may be used.

In the expression (2) used in the above embodiment, all of Rohm, Rct1, Rc2, C1, C2 are used as variables of the function of the first term on the right side, but for example, at least one of them may be used. Further, when the equivalent circuit including either ones of the parallel elements of Rct1 and C1, or the parallel elements of Rct2 and C2 are used as described above, at least one of these parallel elements may be used. In the case of the equivalent circuit where the three or more parallel elements are connected, a part of the parallel elements may be used.

In the expression (2) used in the above embodiment, all of Rohm, Rct1, Rc2, C1, C2 are used as the variables of the function of the first term on the right side, but a value of change or a rate of change from a predetermined time (for example, the time when the secondary battery 14 is mounted on the vehicle) of all of or a part of the components may be used.

In the expression (2) used in the above embodiment, the value found by the function f( ) whose variables are the components of the equivalent circuit is multiplied by the function g( ) whose variable is the use history to make the correction by using the use history. That is, the estimation result is corrected. However, the respective equivalent circuit components may be directly multiplied by correction coefficients based on the use history for all of or a part of Rohm, Rct1, Rct2, C1, C2. That is, the estimation process may be corrected.

In the above embodiment, the function f( ) is constantly multiplied by the function g( ) whose variable is the use history, but the multiplication may be performed when, for example, the use time exceeds a predetermined time, or the value of the function f( ) becomes a predetermined threshold value or less.

In the above embodiment, the values where the charging capacity, the discharging capacity, the charge time, and the discharge time are stratified by the SOC are used as the use history, but other histories may be used. For example, a frequency (the number of times) to be a predetermined state of charge or less or an integrated time may be used, or a frequency (the number of times) to be a predetermined state of charge or more or an integrated time may be used. The stratification may be done not by the state of charge (SOC) but by, for example, the voltage, the temperature, and the current of the secondary battery 14.

The secondary battery 14 has a configuration having a plurality of cells as illustrated in FIG. 4A, but for example, it may be formed by serially connecting a plurality of independent secondary batteries.

EXPLANATION OF REFERENCE SIGNS 1 secondary battery deterioration estimation device
10 control part (finding unit, estimation unit)
10a CPU
10b ROM
10c RAM (storage unit)
10d communication part
10e I/F
11 voltage sensor
12 current sensor
13 temperature sensor
14 secondary battery
15 discharge circuit
16 alternator
17 engine
18 starter motor
19 load

The invention claimed is:

1. A secondary battery deterioration estimation device for estimating deterioration of a secondary battery, comprising:
a processor; and
a memory that stores executable instructions that, when executed by the processor, facilitate performance of operations, comprising:
receiving a first signal representing a discharging voltage from a voltage detector;
receiving a second signal representing a discharging current from a current detector;
calculating values of elements forming an equivalent circuit of the secondary battery;
calculating a state of health (SOH) of the secondary battery based on the values of the elements forming the equivalent circuit;
generating history information showing history of a use state of the secondary battery;
stratifying the history information based on an amount of time of use of the secondary battery to produce stratified history information;
calculating the SOH of the secondary battery based on the stratified history information;
determining a deterioration state of the secondary battery with reference to at least one of the SOH calculated by the values of the elements or the SOH calculated by the stratified history information in accordance with a state of the secondary battery;
calculating information regarding a variation of deterioration of cells forming the secondary battery from the stratified history information;
correcting the values of the elements before the SOH is calculated or a value of the SOH obtained by the calculation based on the calculated information; and
outputting data representing the deterioration state of the secondary battery.

2. The secondary battery deterioration estimation device according to claim 1, wherein the operations further comprise:
calculating a correction value based on the variation of deterioration of cells forming the secondary battery; and
making a correction by multiplying the SOH by the correction value, a difference between the correction and the SOH decreasing as the variation is reduced.

3. The secondary battery deterioration estimation device according to claim 1, wherein the operations further comprise:
generating the history information based on at least one of a quantity of charged and discharged electricity for the secondary battery, a time or a number of times to be a predetermined state of charge or less, a time or a number of times to be the predetermined state of charge or more, and an elapsed time from a use start of the secondary battery.

4. The secondary battery deterioration estimation device according to claim 1, wherein the equivalent circuit of the secondary battery includes at least one of a resistance component corresponding to a conductor element and an electrolytic solution resistance in the secondary battery, a resistance component corresponding to a reaction resistance of an active material reaction of an electrode, and a capacitive component corresponding to an electric double layer of an interface between the electrode and the electrolytic solution.

5. The secondary battery deterioration estimation device according to claim 1, wherein the operations further comprise:
estimating the deterioration state of the secondary battery after the elements forming the equivalent circuit are corrected to values at a temperature and a state of charge under a reference state.

6. The secondary battery deterioration estimation device according to claim 1, further comprising:
an output circuit that outputs warning when the value of the SOH obtained by the correction is smaller than a predetermined threshold value.

7. A secondary battery deterioration estimation device for estimating deterioration of a secondary battery, comprising:
a unit that generates history information showing history of charge and discharge of the secondary battery with reference to a signal output from a current sensor detecting a current flowing through the secondary battery;

a unit that stratifies the history information based on at least one of a state of charge, a voltage, a current, a temperature, and an amount of time of use of the secondary battery to produce stratified history information;

a unit that calculates values of elements forming an equivalent circuit of the secondary battery;

a unit that calculates a state of health (SOH) of the secondary battery based on the values of the elements forming the equivalent circuit;

a unit that calculates information regarding a variation of deterioration of cells forming the secondary battery from the stratified history information; and a unit that corrects the values of the elements before the SOH is calculated or a value of the SOH obtained by the calculation based on the stratified history information.

8. A secondary battery deterioration estimation method for estimating deterioration of the secondary battery, performed by a programmable processor connected to a current sensor detecting a current flowing through the secondary battery, the method comprising:

generating history information showing history of a use state of the secondary battery with reference to a signal output from the current sensor;

stratifying the history information based on at least one of a state of charge, a voltage, a current, a temperature, and an amount of time of use of the secondary battery to produce stratified history information;

calculating values of elements forming an equivalent circuit of the secondary battery;

calculating a state of health (SOH) of the secondary battery based on the values of the elements forming the equivalent circuit;

calculating information regarding a variation of deterioration of cells forming the secondary battery from the stratified history information;

correcting the values of the elements before the SOH is calculated or a value of the SOH obtained by the calculation based on the stratified history information; and outputting data representing the SOH of the secondary battery.

9. The secondary battery deterioration estimation device of claim 7, wherein the history information comprises a quantity of electricity charged for the secondary battery over time.

10. The secondary battery deterioration estimation device of claim 7, wherein the history information comprises a quantity of electricity discharged for the secondary battery over time.

11. The secondary battery deterioration estimation device of claim 7, wherein the history information comprises a frequency of reaching less than a predetermined state of charge.

12. The secondary battery deterioration estimation device of claim 7, wherein the history information comprises a frequency of reaching more than a predetermined state of charge.

13. The secondary battery deterioration estimation device of claim 7, wherein the history information comprises an elapsed time from when a use of the secondary battery is started.

14. The secondary battery deterioration estimation method of claim 8, wherein a first element of the elements forming an equivalent circuit of the secondary battery comprises a resistance component corresponding to a conductor element and an electrolytic solution resistance in the secondary battery.

15. The secondary battery deterioration estimation method of claim 8, wherein a first element of the elements forming an equivalent circuit of the secondary battery comprises a first capacitive component corresponding to an electric double layer at an interface between the electrode and the electrolytic solution.

16. The secondary battery deterioration estimation method of claim 15, wherein a second element of the elements forming an equivalent circuit of the secondary battery comprises a second capacitive component.

17. The secondary battery deterioration estimation method of claim 8, wherein a first element of the elements forming an equivalent circuit of the secondary battery comprises a first resistance component corresponding to a reaction resistance of an active material reaction of an electrode.

18. The secondary battery deterioration estimation method of claim 17, wherein a second element of the elements forming an equivalent circuit of the secondary battery comprises a second resistance component corresponding to the reaction resistance of the active material reaction of the electrode.

19. The secondary battery deterioration estimation method of claim 8, wherein the history information comprises a quantity of electricity charged for the secondary battery over time.

20. The secondary battery method estimation device of claim 8, wherein the stratifying of the history information comprises:

stratifying at least one of a charging capacity, a discharging capacity, a charge time, and a discharge time.

* * * * *